(12) United States Patent
Sato (10) Patent No.: US 6,566,930 B1
(45) Date of Patent: May 20, 2003

(54) LEVEL SHIFT CIRCUIT USABLE IN A SEMICONDUCTOR DEVICE OPERATING AT LOW VOLTAGE

(75) Inventor: Yuichi Sato, Mie-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/617,087

(22) Filed: Jul. 14, 2000

(30) Foreign Application Priority Data

Jul. 16, 1999 (JP) .......................................... 11-202876

(51) Int. Cl.$^7$ ................................................ H03L 5/00
(52) U.S. Cl. ...................... 327/333; 327/537; 326/68; 326/81
(58) Field of Search ................................ 327/534, 333, 327/374, 537; 326/31, 34, 63, 68, 80, 81

(56) References Cited

U.S. PATENT DOCUMENTS

| | | | | |
|---|---|---|---|---|
| 4,656,373 A | * | 4/1987 | Plus ............................. | 326/81 |
| 5,200,921 A | * | 4/1993 | Okajima ....................... | 326/80 |
| 5,332,932 A | * | 7/1994 | Runaldue ..................... | 307/443 |
| 5,399,920 A | * | 3/1995 | Van Tran ..................... | 326/83 |
| 5,406,141 A | * | 4/1995 | Yero et al. ................... | 326/68 |
| 5,559,996 A | * | 9/1996 | Fujioka ........................ | 326/68 |
| 5,644,266 A | * | 7/1997 | Chen et al. .................. | 327/534 |
| 5,808,346 A | * | 9/1998 | Ueda ........................... | 257/774 |
| 5,821,769 A | * | 10/1998 | Douseki ....................... | 326/34 |
| 6,144,227 A | * | 11/2000 | Sato ............................. | 326/119 |
| 6,177,826 B1 | * | 1/2001 | Mashiko et al. ............ | 327/534 |
| 6,265,896 B1 | * | 7/2001 | Podlesny et al. ........... | 327/333 |
| 6,275,070 B1 | * | 8/2001 | Pantelakis et al. ............ | 326/98 |

FOREIGN PATENT DOCUMENTS

JP          408070247 A    *  3/1996

OTHER PUBLICATIONS

Assaderaghi et al., "A Dynamic Threshold Voltage MOS-FET (DTMOS) for Ultra–Low Voltage Operation," IEEE International Electron Devices Meeting, Technical Digest, pp. 809–812, 1994.*

Chandrakasan et al., Low Power Digital CMOS Design, pp. 324–325.

* cited by examiner

Primary Examiner—Terry D. Cunningham
Assistant Examiner—Long Nguyen
(74) Attorney, Agent, or Firm—Birch, Stewart, Kolasch & Birch, LLP (57) ABSTRACT

A level shift circuit for providing an output signal having a swing larger than a swing of an input signal includes a plurality of MOS transistors constituting a circuit operative at a low voltage and a circuit to which a voltage higher than the low voltage is applied. At least one of the plurality of MOS transistors has a gate which receives a signal having a swing corresponding to the swing of the input signal and which is a MOS transistor whose channel forming semiconductor region is electrically connected to its gate.

14 Claims, 8 Drawing Sheets

Fig. 1A

Fig. 1B 
NDTMOS

Fig. 1C 
PDTMOS

Fig. 1D 
PMOS

Fig. 2A

Fig.2B  Fig.2C NDTMOS

Fig.2D  PDTMOS

Fig.2E  PMOS

LEVEL SHIFT CIRCUIT USABLE IN A SEMICONDUCTOR DEVICE OPERATING AT LOW VOLTAGE

BACKGROUND OF THE INVENTION

The present invention relates to a level shift circuit usable in a semiconductor device which operates internally at a low voltage.

LSIs (Large-Scale Integrated circuits) have been advancing toward higher speeds and higher integrations with the progress of microfabrication techniques. Low power consumption of LSIs is one of key techniques for practical use of LSIs that operate at high speed. For high-speed operation of these LSIs, because larger power consumption is involved, ceramic packages are adopted for stable operation, or radiation fins and the like are necessitated, which poses a problem that the cost increases. Also, in the case of small-size, lightweight portable equipment which is popular these days, low power consumption is of importance from the point of view of running time of batteries as well.

Although lowering the operating voltage is very effective in lowering the power consumption of an LSI, there is a need of enlarging input/output signal swings in order that signal exchange with other LSIs is enabled even if internal operating voltage VDD is lowered, in which case a level shift circuit for enlarging signal swings is necessitated.

Figure 10:
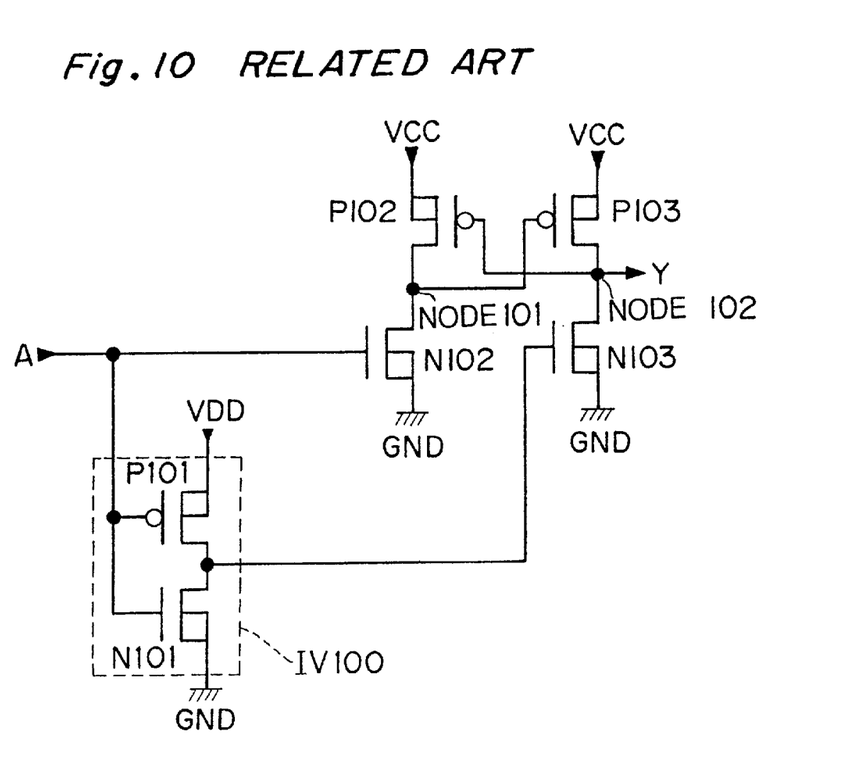
FIG. 10 is a circuit diagram of a level shift circuit according to the related art.

A conventional LSI that operate with low voltage is provided with a level shift circuit shown in FIG. 10, which interfaces externally with a voltage higher than the LSI's internal voltage. This level shift circuit, as shown in FIG. 10, has: an N-channel MOS (Metal Oxide Semiconductor) field effect transistor (hereinafter, referred to as NMOS transistor) N101 to the gate of which an input signal A is supplied and the source of which is connected to the ground GND; a P-channel MOS field effect transistor (hereinafter, referred to as PMOS transistor) P101 the drain of which is connected to the drain of the NMOS transistor N101 and to the gate of which the input signal A is connected; an NMOS transistor N102 to the gate of which the input signal A is connected and the source of which is connected to the ground GND; an NMOS transistor N103 the gate of which is connected to the drain of the NMOS transistor N101 and the source of which is connected to the ground GND; a PMOS transistor P102 the gate of which is connected to the drain (node 102) of the NMOS transistor N103 and the drain of which is connected to the drain (node 101) of the NMOS transistor N102 and the source of which is connected to power supply VCC; and a PMOS transistor P103 the gate of which is connected to the drain (node 101) of the NMOS transistor N102 and the source of which is connected to the power supply VCC and the drain of which is connected to the drain (node 102) of the NMOS transistor N103. The NMOS transistor N101 and the PMOS transistor P101 constitute an inverter circuit IV100, and this inverter circuit IV100 operates with internal power supply VDD (<VCC) connected to the source of the PMOS transistor P101 and outputs an inverted signal of the input signal A. Then, the level shift circuit shifts the level of the input signal A to produce an output signal Y having a swing larger than that of the input signal A.

However, when a large level shift amount is involved, for example, when a swing of 0.5 V is changed to a swing of 3.3 V, because the driving current of the MOS transistor that operates at 0.5 V is small, the delay time of the circuit is increased, causing a problem of lowered operating speed of the circuit. As a solution to it, it is conceivable to lower the threshold, voltage Vth of the MOS transistor so that the driving current of the MOS transistor does not become so small even at low voltage. However, lowering the threshold voltage Vth would cause the leak current of the MOS transistor to increase, posing a problem that the power consumption increases due to the leak current even in the standby mode. Also, employing a microfabrication process in which the gate oxide is reduced in film thickness to increase the driving current of the MOS transistor that operates at 0.5 V would lead to a problem that the transistor would not be able to endure a voltage of 3.3. V, leading to breakdown.

SUMMARY OF THE INVENTION

Therefore, an object of the present invention is to provide a level shift circuit capable of realizing low power consumption without lowering the operating speed at a low voltage, while securely preventing the breakdown with ease.

In order to accomplish the above object, according to a first aspect of the present invention, there is provided a level shift circuit for providing an output signal having a swing larger than a swing of an input signal, the level shift circuit including a plurality of MOS transistors constituting a circuit operative at a low voltage and a circuit to which a voltage higher than the low voltage is applied, wherein among the plurality of MOS transistors, at least one of MOS transistors to gates of which a signal having a swing corresponding to the swing of the input signal is supplied is a MOS transistor whose channel forming semiconductor region is electrically connected to its gate.

Note here that the words "channel forming semiconductor region" of a MOS transistor refers to a semiconductor region where a channel is to be formed when the transistor is turned on.

Also, there is provided a level shift circuit, according to a second aspect of the present invention, for providing an output signal having a swing smaller than a swing of an input signal, the level shift circuit including a plurality of MOS transistors constituting a circuit operative at a low voltage, wherein at least one of the plurality of MOS transistors is a MOS transistor whose channel forming semiconductor region is electrically connected to its gate.

Also, there is provided a level shift circuit according to a third aspect of the invention, comprising:

an inverter circuit having a first first-conductivity-type MOS transistor and a first second-conductivity-type MOS transistor connected complementary to each other between a first power supply and a ground, the inverter circuit providing an inverted signal of an input signal;

a second first-conductivity-type MOS transistor to a gate of which the input signal is connected and a source of which is connected to the ground;

a third first-conductivity-type MOS transistor to a gate of which an output of the inverter circuit is connected, and a source of which is connected to the ground;

a second second-conductivity-type MOS transistor whose gate is connected to a drain of the third first-conductivity-type MOS transistor, and whose source is connected to a second power supply, and whose drain is connected to a drain of the second first-conductivity-type MOS transistor; and a third second-conductivity-type MOS transistor whose gate is connected to the drain of the second first-conductivity-type MOS transistor, and whose source is connected to the second power supply, and whose drain is connected to the drain of the third first-conductivity-type MOS transistor, wherein the first first-conductivity-type MOS transistor and the first second-conductivity-type MOS transistor of the inverter circuit, and the second and third first-conductivity-type MOS transistors are each a MOS transistor whose channel forming semiconductor region is electrically connected to its gate.

Furthermore, a level shift circuit of a fourth aspect of the invention comprises an inverter circuit having a first-conductivity-type MOS transistor and a second-conductivity-type MOS transistor connected complementary to each other between a power supply and a ground, the inverter circuit providing an inverted signal of an input signal, the inverted signal shifted in level to a swing smaller than a swing of the input signal, wherein either one of the first-conductivity-type MOS transistor or the second-conductivity-type MOS transistor of the inverter circuit is a MOS transistor whose channel forming semiconductor region is electrically connected to its gate.

Still further, there is provided a level shift circuit according to a fifth aspect of the invention comprising:

an inverter circuit having a first first-conductivity-type MOS transistor and a first second-conductivity-type MOS transistor connected complementary to each other between a first power supply and a ground, the inverter circuit providing an inverted signal of an input signal;

a second first-conductivity-type MOS transistor to a gate of which the input signal is connected, and a source of which is connected to the ground;

a third first-conductivity-type MOS transistor whose gate is connected to an output of the inverter circuit, and whose source is connected to the ground;

a second second-conductivity-type MOS transistor whose gate is connected to a drain of the third first-conductivity-type MOS transistor, and whose source is connected to a second power supply, and whose drain is connected to a drain of the second first-conductivity-type MOS transistor; and a third second-conductivity-type MOS transistor whose gate is connected to the drain of the second first-conductivity-type MOS transistor, and whose source is connected to the second power supply, and whose drain is connected to the drain of the third first-conductivity-type MOS transistor, wherein the second and third second-conductivity-type MOS transistors are each a MOS transistor whose channel forming semiconductor region is electrically connected to its gate.

In the level shift circuit of each of the first to fifth aspects of the invention, the first-conductivity-type may be one of P-channel type and N-channel type and the second-conductivity-type may be the other of the P-channel type and N-channel type.

In the level shift circuit of the third aspect of the invention, if the first-conductivity-type is the N-channel type and the second-conductivity-type is the P-channel type, the levels of the first power supply, the second power supply and the ground may be: second power supply level>first power supply level>ground level. On the other hand, if the first-conductivity-type is the P-channel type and the second-conductivity-type is the N-channel type, the levels of the first power supply, the second power supply and the ground may be: second power supply level<first power supply level<ground level.

In the level shift circuit of the fifth aspect of the invention, if the first-conductivity-type is the N-channel type and the second-conductivity-type is the P-channel type, the levels of the first power supply, the second power supply and the ground may be: first power supply level>second power supply level>ground level. On the other hand, if the first-conductivity-type is the P-channel type and the second-conductivity-type is the N-channel type, the levels of the first power supply, the second power supply and the ground may be: first power supply level<second power supply level<ground level.

In the level shift circuit of each of the first to fifth aspects of the invention, in the process of turning on the MOS transistor whose channel forming semiconductor region is electrically connected to the gate, the voltage of the channel-forming semiconductor region increases with the increasing gate voltage, so that the threshold voltage for the MOS transistor lowers and the driving current increases. When this MOS transistor is turned off, the threshold voltage is maintained, as in the ordinary MOS transistors, so that the leak current is suppressed. That is, in the MOS transistor with the channel forming semiconductor region electrically connected to the gate, the threshold voltage dynamically changes. According to the invention, by using such a MOS transistor having a dynamically changing threshold voltage, it is possible to obtain a large driving current even at a low voltage, while suppressing leak currents. Thus, there can be provided a level shift circuit in which low power consumption can be realized without lowering the operating speed at a low voltage. Also, by using the MOS transistor in which the threshold voltage dynamically changes, the on-resistance of the MOS transistor can be reduced without increasing gate length or gate width, so that the circuit area can be made smaller than a conventional circuit.

The level shift circuit according to any one of the first to fifth aspects may be built into a semiconductor device (such as a system LSI) which operates internally at a low voltage. In this case, there can be provided a highly reliable semiconductor device which is interfaceable with external at a voltage higher than in the internal of the semiconductor device, and which allows low power consumption without decreasing the operation speed in a low voltage operation.

To securely and easily prevent the breakdown of the transistors to thereby improve the reliability of the device, the following measures can be taken.

For example, in one embodiment of the level shift circuit of the third aspect of the invention, the second and third first-conductivity-type MOS transistors and the second and third second-conductivity-type MOS transistors, to which a relatively large voltage is applied, each have a gate oxide larger in film thickness than gate oxides of the first first-conductivity-type MOS transistor and the first second-conductivity-type MOS transistor of the inverter circuit, to which a relatively low voltage is applied.

In another embodiment, the drain of the second first-conductivity-type MOS transistor and the drain of the second second-conductivity-type MOS transistor are connected to each other via one or more fourth second-conductivity-type MOS transistors, and the drain of the third first-conductivity-type MOS transistor and the drain of the third second-conductivity-type MOS transistor are connected to each other via one or more fifth second-conductivity-type MOS transistors. Each of the fourth and fifth second-conductivity-type MOS transistors has its gate and drain connected to each other.

In a further embodiment, the drain of the second first-conductivity-type MOS transistor and the drain of the second second-conductivity-type MOS transistor are connected to each other via one or more series-connected diodes, with an anode of each diode directed toward the drain of the second second-conductivity-type MOS transistor, and with a cathode thereof directed toward the drain of the second first-conductivity-type MOS transistor, and the drain of the third first-conductivity-type MOS transistor and the drain of the third second-conductivity-type MOS transistor are connected to each other via one or more series-connected diodes, with an anode of each diode directed toward the drain of the third second-conductivity-type MOS transistor, and with a cathode thereof directed toward the drain of the third first-conductivity-type MOS transistor.

The immediately above two embodiments intend to avoid application of a high voltage to the drains of the second and third first-conductivity-type MOS transistors which receive a low voltage at their respective gates.

In still another embodiment, the second power supply and the source of the second second-conductivity-type MOS transistor are connected to each other via one or more series-connected diodes, with an anode of each diode directed toward the second power supply, and with a cathode thereof directed toward the source of the second second-conductivity-type MOS transistor, and the second power supply and the source of the third second-conductivity-type MOS transistor are connected to each other via one or more series-connected diodes, with an anode of each diode directed toward the second power supply and with a cathode thereof directed toward the source of the third second-conductivity-type MOS transistor. This embodiment also intends to avoid application of a high voltage to the drains of the second and third first-conductivity-type MOS transistors which receive a low voltage at their respective gates. Also, this embodiment eliminates MOS transistors that have a thick gate oxide, which is difficult to form, and that have a low threshold. Thus, the MOS transistors of the level shift circuit can be formed in a simplified process.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

[First Embodiment]

Figure 1A:
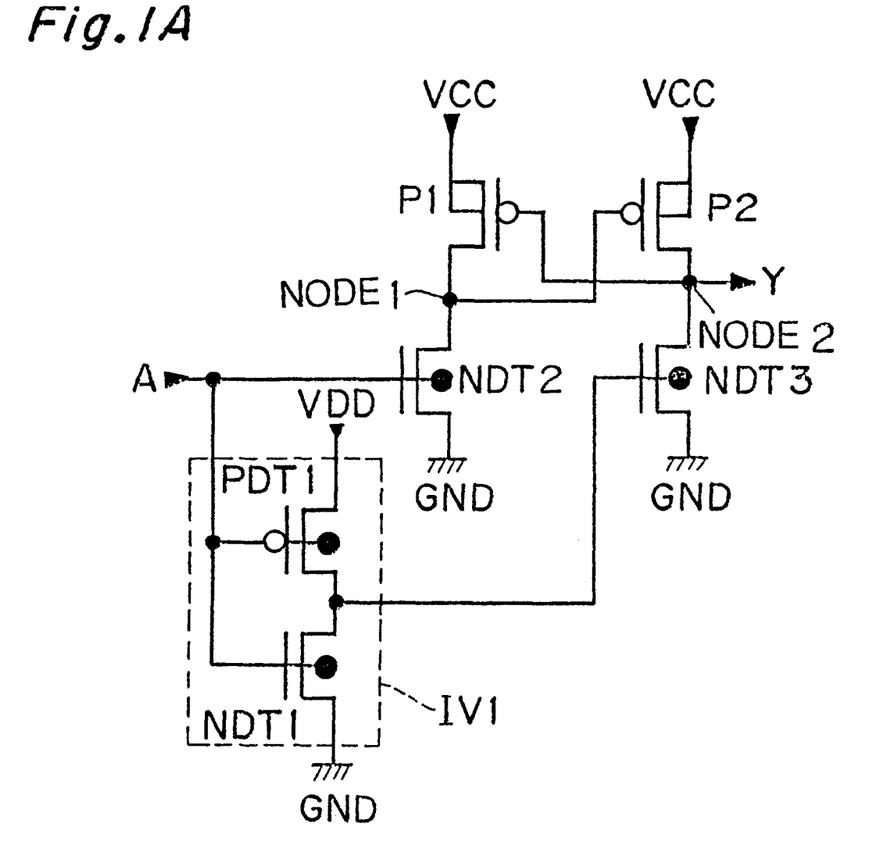
FIG. 1A is a circuit diagram of a level shift circuit according to a first embodiment of the invention and FIGS. 1B, 1C and 1D show symbols representing NDTMOS, PDTMOS and PMOS, respectively.

FIG. 1A shows a circuit diagram of the level shift circuit of a first embodiment of the invention. This level shift circuit, as shown in FIG. 1A, has: an NMOS transistor NDT1 as a first first-conductivity-type MOS transistor to the gate of which an input signal A is supplied and the source of which is connected to the ground GND; a PMOS transistor PDT1 as a first second-conductivity-type MOS transistor the drain of which is connected to the drain of the NMOS transistor NDT1 and to the gate of which the input signal A is connected; an NMOS transistor NDT2 as a second first-conductivity-type MOS transistor to the gate of which the input signal A is connected and the source of which is connected to the ground GND; an NMOS transistor NDT3 as a third first-conductivity-type MOS transistor the gate of which is connected to the drain of the NMOS transistor NDT1 and the source of which is connected to the ground GND; a PMOS transistor P1 as a second second-conductivity-type MOS transistor the gate of which is connected to the drain (node 2) of the NMOS transistor NDT3 and the drain of which is connected to the drain (node 1) of the NMOS transistor NDT2 and the source of which is connected to power supply VCC as a second power supply; and a PMOS transistor P2 as a third second-conductivity-type MOS transistor the gate of which is connected to the drain (node 1) of the NMOS transistor NDT2 and the source of which is connected to the power supply VCC and the drain of which is connected to the drain (node 2) of the NMOS transistor NDT3. The NMOS transistor NDT1 and the PMOS transistor PDT1 constitute an inverter circuit IV1, and this inverter circuit IV1 operates with internal power supply VDD as a first power supply connected to the source of the PMOS transistor PDT1 and outputs an inverted signal of the input signal A.

The NMOS transistor NDT1 and PMOS transistor PDT1 of the inverter circuit IV1, and NMOS transistors NDT2, NDT3 are each a MOS transistor in which a channel forming semiconductor region is electrically connected to the gate (the MOS transistor is hereinafter referred to as a 'DTMOS' (Dynamic Threshold voltage MOS)). In each of the PMOS transistors P1, P2, the power supply VCC is connected to the channel forming semiconductor region.

Figure 1B:
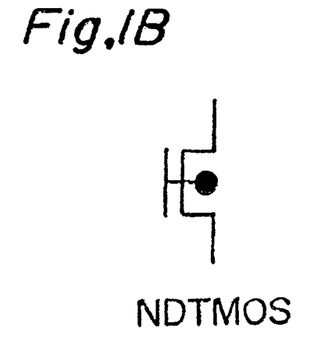
Figure 1C:
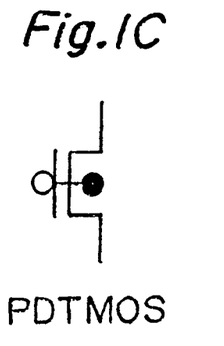
Figure 1D:
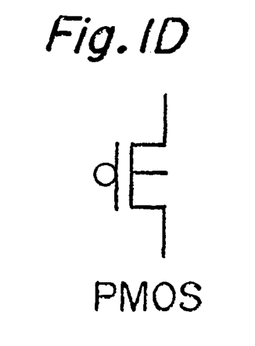

FIG. 1B shows a notation of NDTMOS (N-channel DTMOS) having a thin film thickness of gate oxide, i.e. NMOS transistors NDT1–NDT3, FIG. 1C shows a notation of PDTMOS (P-channel DTMOS) having a thin film thickness of gate oxide, i.e. PMOS transistor PDT1, and FIG. 1C shows a notation of PMOS having a thin film thickness of gate oxide, i.e. PMOS transistors P1, P2.

Differences between the level shift circuit of this first embodiment and the level shift circuit of the related art (shown in FIG. 10) exist in that in each NMOS transistor NDT1–NDT3 of the embodiment, the channel forming semiconductor region is connected to the gate, while in the NMOS transistors of the level shift circuit shown in FIG. 10, such a semiconductor region is connected to the ground GND, and that in the PMOS transistor PDT1 in the embodiment, the channel forming semiconductor region is connected to the gate, while in the PMOS transistor in the level shift circuit of FIG. 10, such a semiconductor region is connected to the internal power supply VDD.

The following describes how the level shift circuit of this constitution operates with an internal power supply VDD of 0.5 and a power supply VCC of 2 V.

First, an input signal A having a swing of 0.5 V between the ground GND (0 V) and the internal power supply VDD is converted to an inverted signal by the inverter circuit IV1.

Assuming that the input signal A is at the internal power supply VDD level, its inverted signal output from the inverter circuit IV1 is at the GND level. Then, the NMOS transistor NDT2, to the gate of which the input signal A is connected, is turned on, while the NMOS transistor NDT3, to the gate of which the output of the inverter circuit IV1 is connected, is turned off. Because the NMOS transistor NDT2 is turned on, the GND level is led out to the node 1. In this case, assuming that the on-resistance of the NMOS transistor NDT2 is RN1, the onresistance of the PMOS transistor P1 is RP1, and that the threshold voltage of the PMOS transistor P2 is Vthp, the threshold voltage Vthp has been set so as to satisfy the following relationship.

$$|Vthp| < VCC \times RP1/(RN1+RP1) \qquad (1)$$

Therefore, even if the PMOS transistor P1 is still on because of the node 2 at the GND level by the effect of parasitic capacitance, the PMOS transistor P2 is turned on, the power supply VCC level is led out to the node 2 and the PMOS transistor P1 is turned off.

Next, once the input signal A comes to the GND level, the output of the inverter circuit IV1 goes VDD level. Accordingly, the NMOS transistor NDT2, to the gate of which the input signal A is connected, is turned off, while the NMOS transistor NDT3, to the gate of which the output of the inverter circuit IV1 is connected, is turned on. Because the NMOS transistor NDT3 is turned on, the GND level is led out to the node 2. In this case, assuming that the on-resistance of the NMOS transistor NDT3 is RN2, the on-resistance of the PMOS transistor P2 is RP2, and that the threshold voltage of the PMOS transistor P1 is Vthp, the threshold voltage Vthp has been set so as to satisfy the following relationship.

$$|Vthp| < VCC \times RP2/(RN2+RP2) \qquad (2)$$

Therefore, even if the PMOS transistor P2 is still on because of the node 1 being at the GND level by the effect of parasitic capacitance, the PMOS transistor P1 is turned on, the power supply VCC level is led out to the node 1 and the PMOS transistor P2 is turned off. In this way, the input signal is shifted in level to a swing of 2 V with the phase unchanged and output from the node 2 as an output signal Y, while an inverted signal of the input signal shifted in level to the swing of 2 V appears at the node 1.

In the DTMOS transistors (NDT1, 2, 3 and PDT1), because the channel forming semiconductor region and the gate are electrically connected to each other, the threshold voltage Vth falls at a turn-on while the threshold voltage Vth rises at a turn-off. Therefore, in this case, there can be provided a level shift circuit in which the ON-state driving current can be enlarged even with low voltage while the OFF-state leak current can be suppressed, and in which low power consumption can be realized without lowering the operating speed at low voltage. Also, use of the DTMOS transistors in which the threshold voltage dynamically changes allows the reduction of the on-resistance of the MOS transistors without increasing gate length or gate width, so that the circuit area can be made smaller than the conventional counterpart.

[Second Embodiment]

Figure 2A:
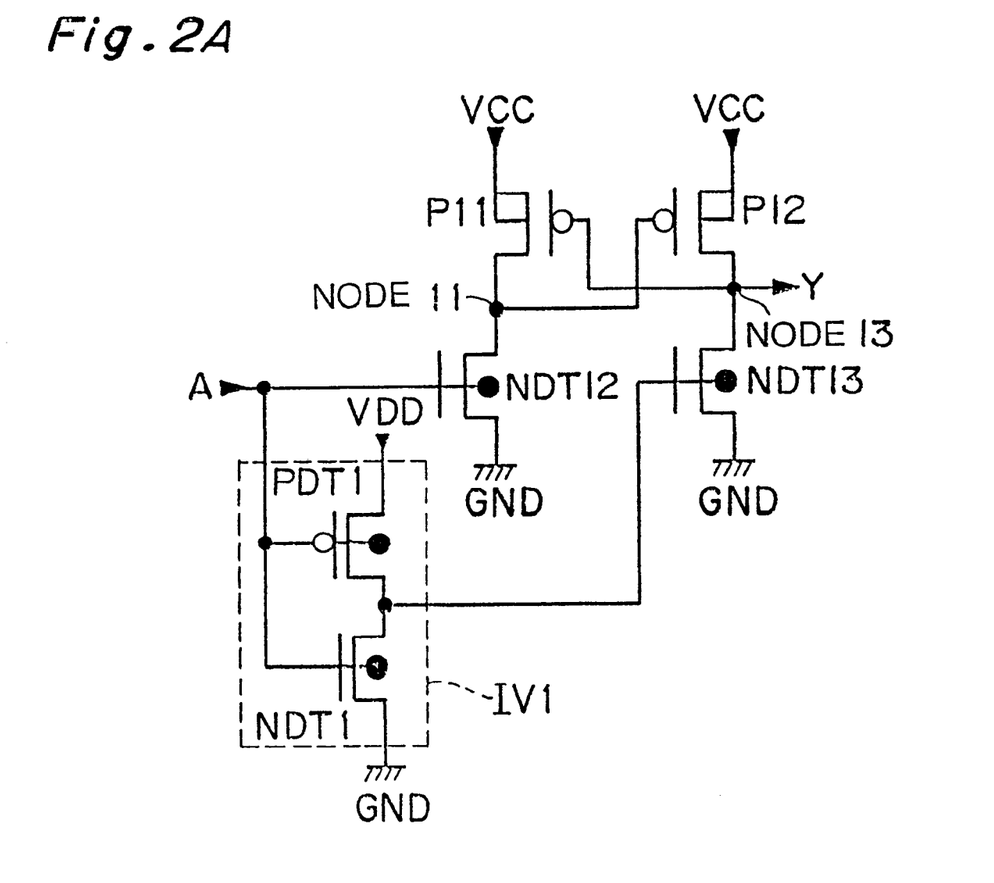
FIG. 2A is a circuit diagram of a level shift circuit according to a second embodiment of the invention.

FIG. 2A shows a circuit diagram of a level shift circuit according to a second embodiment of the invention. This level shift circuit is similar in configuration to the level shift circuit shown in FIG. 1A of the first embodiment, except the film thickness of gate oxide of NMOS transistors NDT12, NDT13 and PMOS transistors P11, P12.

For example, in order to operate the internal logical circuit with an internal power supply VDD of 0.5 V as a first power supply, the film thickness of gate oxide should be as thin as possible, desirably. However, if the gate oxide of the MOS transistor that operates with an internal power supply VDD of 0.5 V is made as thin as about 3–5 nm by microfabrication technique, then it becomes difficult to operate the MOS transistor at 3.3 V in terms of the breakdown voltage of the MOS transistor.

Therefore, in the level shift circuit shown in FIG. 2A, the film thickness of gate oxide for the NMOS transistor NDT1 and the PMOS transistor PDT1 of the inverter circuit IV1 that operates with the internal power supply VDD of 0.5 V is set to about 3 nm while the film thickness of gate oxide for the other NMOS transistors NDT12, NDT13 and PMOS transistors P11, P12 is set as thick as about 7 nm, so that these transistors can withstand the voltage of 3.3 V. Thus, this level shift circuit can surely endure such a large voltage as causes breakdown with ease.

Figures 2B, 2C:
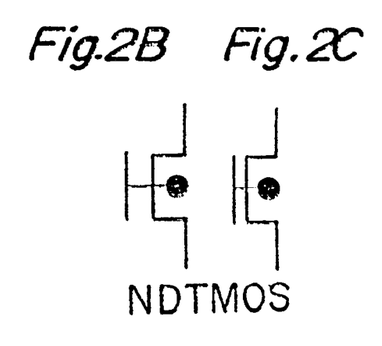
FIGS. 2B and 2C show a symbol representing NDTMOS.
Figure 2D:
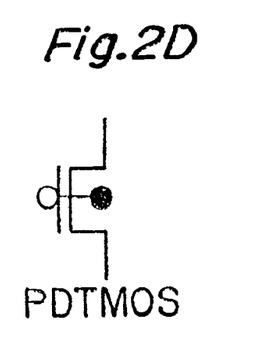
FIGS. 2D and 2E show symbols representing PDTMOS and PMOS, respectively.
Figure 2E:
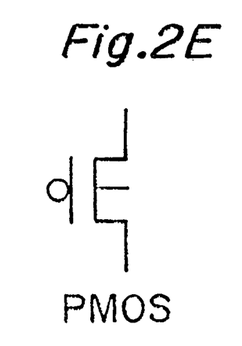

FIG. 2B shows a notation of NDTMOS (NDT12, NDT13) having a thick film thickness of gate oxide, FIG. 2C shows a notation of NDTMOS (NDT1) having a thin film thickness of gate oxide, FIG. 2D shows a notation of PDTMOS (PDT1) having a thin film thickness of gate oxide, and FIG. 2E shows a notation of PMOS (P1, P2) having a thick film thickness of gate oxide.

The level shift circuit of the second embodiment operates with an internal power supply VDD of 0.5 V and a power supply VCC of 3.3 V in the same manner as the level shift circuit of the first embodiment. In the second embodiment also, as in the case of the level shift circuit of the first embodiment, the on-resistance of the DTMOS transistors is small, so that the driving current can be enlarged. In addition, the OFF-state leak current is suppressed. Thus, there is realized a level shift circuit which allows low power consumption and which is operated at low voltage without lowering the operating speed.

The level shift circuit of the second embodiment is enabled to achieve a level shift to a higher voltage (VCC), as compared with the level shift circuit of the first embodiment. However, the process of forming MOS transistors is more complex because ion implantation steps are increased due to the difference in amount of impurity ion implantation for determining the threshold voltage between the transistors which have a gate oxide film thickness of about 3 nm and which are turned on at 0.5 V (namely, NMOS transistor NDT1 and PMOS transistor PDT1) and the other transistors which have a gate oxide film thickness of about 7 nm and which are turned on at 3.3 V (namely, NMOS transistors NDT12, NDT13).

[Third Embodiment]

Next, a level shift circuit of a third embodiment is describe, which is improved in terms of the complexity of the formation of the MOS transistors.

Figures 3A, 3B, 3C, 3D:
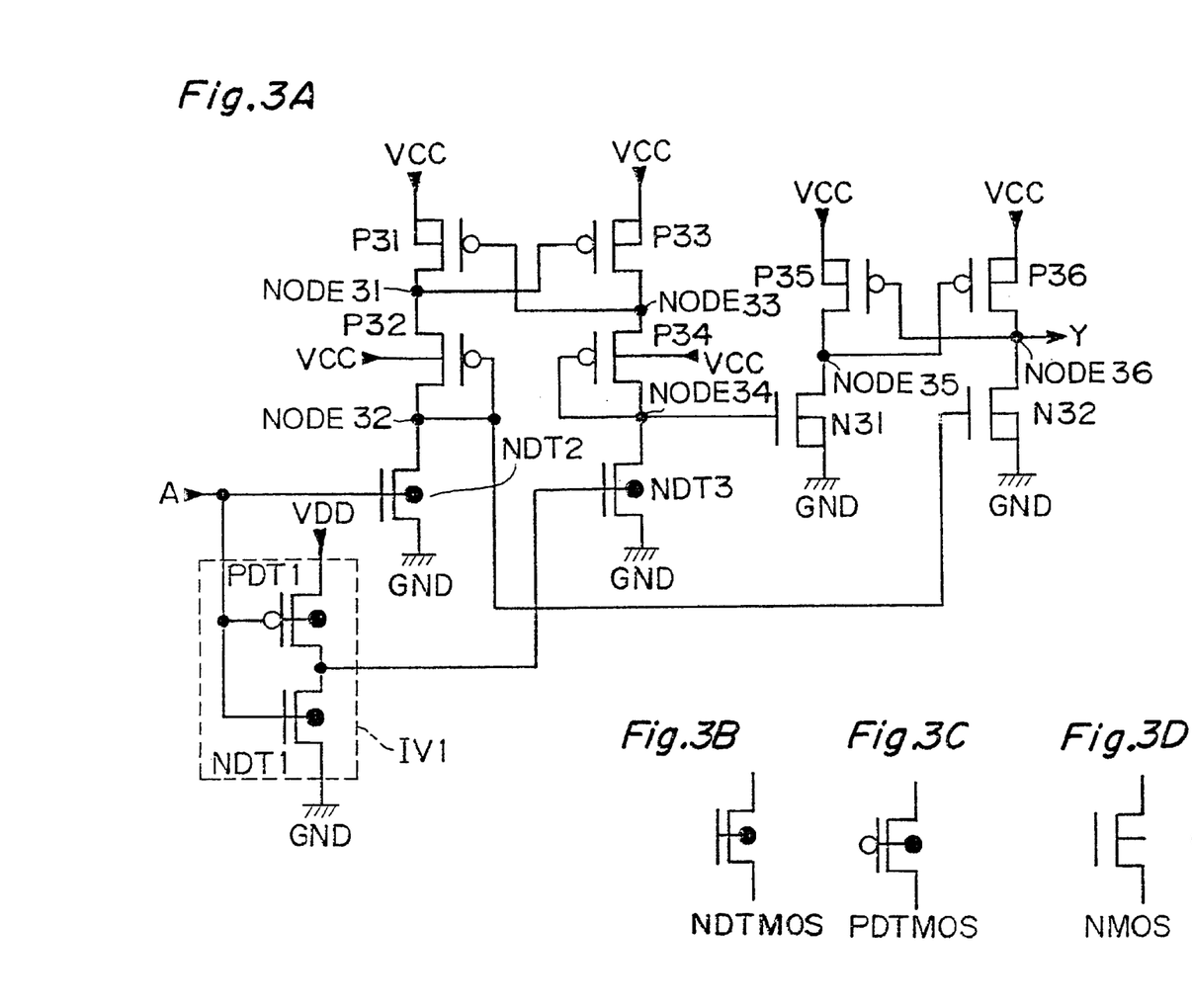
FIG. 3A is a circuit diagram of a level shift circuit according to a third embodiment of the invention.
FIGS. 3B, 3C, 3D and 3E show symbols representing NDTMOS, PDTMOS, NMOS and PMOS, respectively.

FIG. 3A shows a circuit diagram of the level shift circuit of the third embodiment. This level shift circuit, as shown in FIG. 3A, has: an NMOS transistor NDT1 as a first first-conductivity-type MOS transistor to the gate of which an input signal A is supplied and the source of which is connected to the ground GND; a PMOS transistor PDT1 as a first second-conductivity-type MOS transistor the drain of which is connected to the drain of the NMOS transistor NDT1 and to the gate of which the input signal A is connected; an NMOS transistor NDT2 as a second first-conductivity-type MOS transistor to the gate of which the input signal A is connected and the source of which is connected to the ground GND; and an NMOS transistor NDT3 as a third first-conductivity-type MOS transistor the gate of which is connected to the drain of the NMOS transistor NDT1 and the source of which is connected to the ground GND. The NMOS transistor NDT1 and the PMOS transistor PDT1 constitute an inverter circuit IV1, and this inverter circuit IV1 operates with internal power supply VDD as a first power supply connected to the source of the PMOS transistor PDT1 and outputs an inverted signal of the input signal A. The NMOS transistor NDT1 and PMOS transistor PDT1 of the inverter circuit IV1, and NMOS transistors NDT2, NDT3 are each a DTMOS transistor in which a channel forming semiconductor region is electrically connected to the gate.

The level shift circuit further has: a PMOS transistor P31 as a second second-conductivity-type MOS transistor, to the source of which is connected power supply VCC as a second power supply; a PMOS transistor P32 as a fourth second-conductivity-type MOS transistor the source of which is connected to the drain (node 31) of the PMOS transistor P31 and the drain of which is connected to the drain (node 32) of the NMOS transistor NDT2; a PMOS transistor P33 as a third second-conductivity-type MOS transistor the gate of which is connected to the drain (node 31) of the PMOS transistor P31 and the source of which is connected to the power supply VCC and the drain of which is connected to the gate of the PMOS transistor P31; and a PMOS transistor P34 as a fifth second-conductivity-type MOS transistor the source of which is connected to the drain (node 33) of the PMOS transistor P33 and the drain of which is connected to the drain (node 34) of the NMOS transistor NDT3. In each of the PMOS transistors P31–P34, the channel forming semiconductor region is connected to the power supply VCC.

Also, the level shift circuit has: an NMOS transistor N31 the gate of which is connected to the drain (node 34) of the NMOS transistor NDT3 and the source of which is connected to the ground GND; an NMOS transistor N32 the gate of which is connected to the drain (node 32) of the NMOS transistor NDT2 and the source of which is connected to the ground GND; a PMOS transistor P35 the drain of which is connected to the drain (node 35) of the NMOS transistor N31 and the source of which is connected to the power supply VCC; and a PMOS transistor P36 the drain of which is connected to the drain (node 36) of the NMOS transistor N32 and the source of which is connected to the power supply VCC. The gate of the PMOS transistor P35 is connected to the drain (node 36) of the NMOS transistor N32. The gate of the PMOS transistor P36 is connected to the drain (node 35) of the NMOS transistor N31. In each of the PMOS transistors P35 and P36, the channel forming semiconductor region is connected to the power supply VCC, while in each of the NMOS transistors N31 and N32 such a channel forming semiconductor region is connected to the ground GND.

Figure 3E:
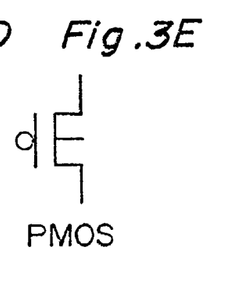

FIG. 3B shows a notation of NDTMOS (NDT1–NDT3) having a thin film thickness of gate oxide, FIG. 3C shows a notation of PDTMOS (PDT1) having a thin film thickness of gate oxide, FIG. 3D shows a notation of NMOS (N31, N32) having a thick film thickness of gate oxide, and FIG. 3E shows a notation of PMOS (P31–P36) having a thick film thickness of gate oxide.

In the level shift circuit with the above arrangement, with the input signal A at the GND level, the NMOS transistor NDT2 is turned off and the NMOS transistor NDT3 is turned on. Then, the GND level is led out to a node 34, and the PMOS transistor P34 is turned on. At this time, given that the threshold voltage of the PMOS transistor P34 is Vthp, the level at the node 33 changes from the power supply VCC level to (0-Vthp). That is, the node 33 settles to a voltage which is higher than the GND level by |Vthp|. The threshold voltage Vthp has been set so as to satisfy the following relationship.

$$VCC - |Vthp| > |vthp| \qquad (3)$$

Accordingly, the PMOS transistor P31, the gate of which is connected to the node 33, is turned on, so that the power supply VCC level is led out to the node 31. As a result, the node 32 that has held the GND level by the parasitic capacitance effect falls by the degree of the threshold voltage of the PMOS transistor P32 to the (VCC−|Vthp|) level.

On the other hand, with the input signal A at the VDD level, the NMOS transistor NDT2 is turned on and the NMOS transistor NDT3 is turned off. Thus, the GND level is led out to the node 32. Given that the threshold voltage of the PMOS transistor P32 is Vthp, the PMOS transistor P32 is turned on, and the node 31 settles to a voltage which is higher than the GND level by |Vthp|.

Since the threshold voltage Vthp has been set so as to satisfy the condition of Equation (3), the PMOS transistor P33, to the gate of which the node 31 is connected, is turned on, so that the power supply VCC level is led out to the node 33. Thus, the node 34 that has held the GND level by the parasitic capacitance effect settles to the (VCC−|vthp|) level.

Given that the threshold voltage of the NMOS transistors N31 and N32 is Vthn1, the threshold voltages Vthn1 and Vthp have been set so as to satisfy the following relationship.

$$VCC - |Vthp| > Vthn1 \qquad (4)$$

Therefore, the level shift circuit operates in the same way as the conventional level shift circuit. The node 36 produces an output signal Y which is in phase with the input signal A and has been shifted in level to a swing of from GND level to VCC level. The node 35 outputs a signal shifted in level to a swing of GND–VCC as an inverted signal of the input signal A.

In this third embodiment, a voltage as low as from GND level up to (VCC−|Vthp|) level is applied to the node 32 and the node 34. Therefore, for example, if Vthp=−1.0 V, then VCC−|vthp|=2.3 V. Thus, if the gate oxide film thickness of the MOS transistors that operate at 0.5 V is about 5 nm, the breakdown of the NMOS transistors NDT2, NDT3 is well prevented.

In this level shift circuit, the PMOS transistors P32, P34 in which the gate is connected to the drain are inserted such that high voltages are not applied to the drains of the second and third NMOS transistors NDT2 and NDT3 which receive low voltages at their gates. Thus, the level shift circuit has good resistance to voltage and has an improved reliability.

[Fourth Embodiment]

Figure 4:
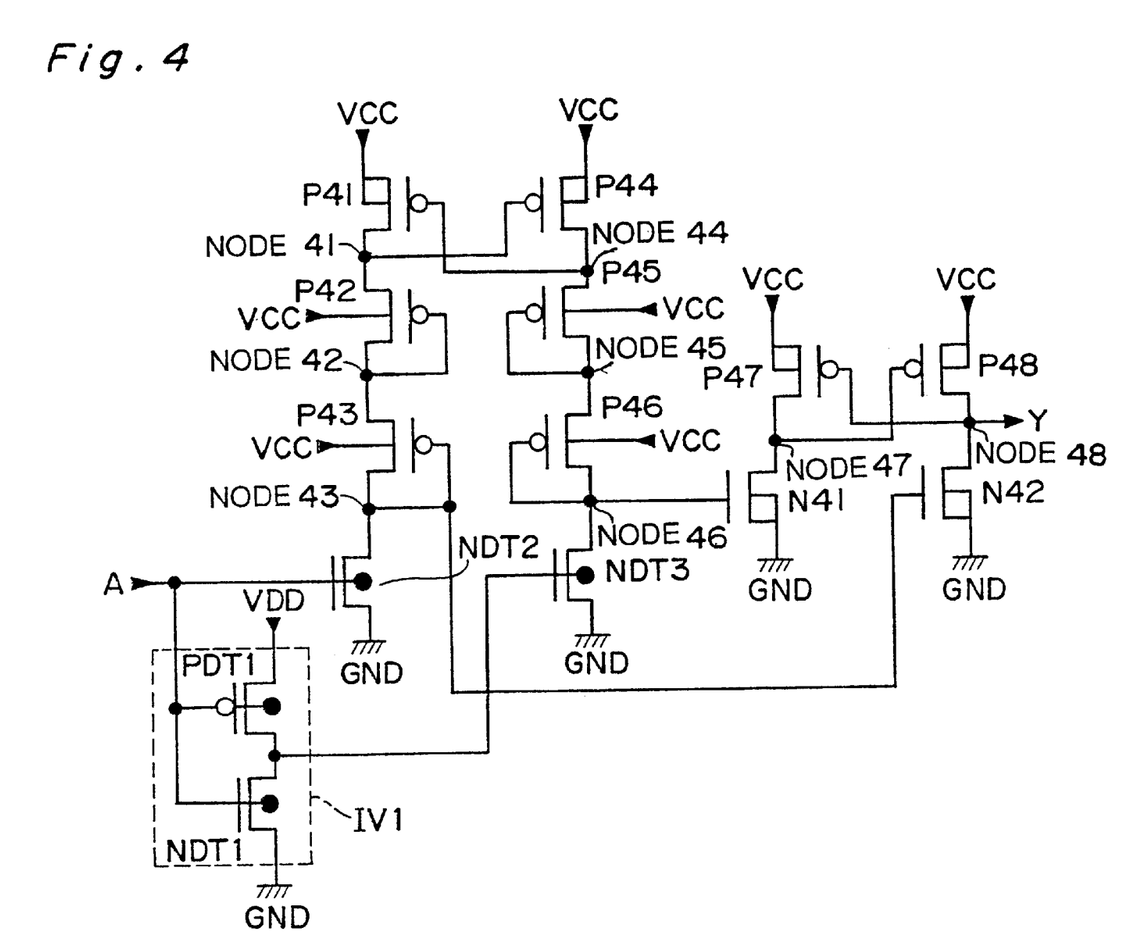
FIG. 4 is a circuit diagram of a level shift circuit according to a fourth embodiment of the invention.

FIG. 4 shows a circuit diagram of the level shift circuit of a fourth embodiment of the invention. This level shift circuit, as shown in FIG. 4, has: an NMOS transistor NDT1 as a first first-conductivity-type MOS transistor the gate of which is supplied with an input signal A and the source of which is connected to the ground GND; a PMOS transistor PDT1 as a first second-conductivity-type MOS transistor the drain of which is connected to the drain of the NMOS transistor NDT1 and to the gate of which the input signal A is connected; an NMOS transistor NDT2 as a second first-conductivity-type MOS transistor to the gate of which the input signal A is connected and the source of which is connected to the ground GND; and an NMOS transistor NDT3 as a third first-conductivity-type MOS transistor the gate of which is connected to the drain of the NMOS transistor NDT1 and the source of which is connected to the ground GND. The NMOS transistor NDT1 and the PMOS transistor PDT1 constitute an inverter circuit IV1, and this inverter circuit IV1 operates with internal power supply VDD as a first power supply connected to the source of the PMOS transistor PDT1 and outputs an inverted signal of the input signal A. The NMOS transistor NDT1 and PMOS transistor PDT1 of the inverter circuit IV1, and NMOS transistors NDT2, NDT3 are each a DTMOS transistor in which a channel forming semiconductor region is electrically connected to the gate.

The level shift circuit further has: a PMOS transistor P41 as a second second-conductivity-type MOS transistor, to the source of which is connected power supply VCC as a second power supply; a PMOS transistor P42 the source of which is connected to the drain (node 41) of the PMOS transistor P41, with the drain and gate connected to each other; a PMOS transistor P43 the source of which is connected to the drain (node 42) of the PMOS transistor P42, and the gate and drain of which are connected to the drain (node 43) of the NMOS transistor NDT2; a PMOS transistor P44 as a third second-conductivity-type MOS transistor the gate of which is connected to the drain (node 41) of the PMOS transistor P41 and the source of which is connected to the power supply Vcc; a PMOS transistor P45 the source of which is connected to the drain (node 44) of the PMOS transistor P44, and the drain and gate of which are connected to each other; and a PMOS transistor 46 the source of which is connected to the drain (node 45) of the PMOS transistor P45, and the gate and drain of which are connected to the drain (node 46) of the NMOS transistor NDT3. The gate of the PMOS transistor P41 is connected to the node 44. In each of the PMOS transistors P41–P46, a channel forming semiconductor region is connected to the power supply VCC. The PMOS transistors P42 and P43 are fourth second-conductivity-type MOS transistors. The PMOS transistors P45 and P46 are fifth second-conductivity-type MOS transistors.

Also, the level shift circuit has: an NMOS transistor N41 the gate of which is connected to the drain (node 46) of the NMOS transistor NDT3 and the source of which is connected to the ground GND; an NMOS transistor N41 the gate of which is connected to the drain (node 43) of the NMOS transistor NDT2 and the source of which is connected to the ground GND; a PMOS transistor P47 the drain of which is connected to the drain (node 47) of the NMOS transistor N41 and the source of which is connected to the power supply VCC; and a PMOS transistor P48 the drain of which is connected to the drain (node 48) of the NMOS transistor N42 and the source of which is connected to the power supply VCC. The gate of the PMOS transistor P47 is connected to the drain (node 48) of the NMOS transistor N42. The gate of the PMOS transistor P48 is connected to the drain (node 47) of the NMOS transistor N41. In each of the PMOS transistors P47 and P48, a channel forming semiconductor region is connected to the power supply VCC, while in each of the NMOS transistors N41 and N42 such a semiconductor region is connected to the ground GND.

The level shift circuit of this fourth embodiment is directed to a case in which the gate oxide film thickness of the MOS transistors that operate at 0.5 V is as thin as about 3 nm. In the circuit of FIG. 4, the two PMOS transistor P42 and P43 connected in series are used, instead of the PMOS transistor P32 shown in FIG. 3 of the third embodiment, while the two PMOS transistor P45 and P46 connected in series are used, instead of the PMOS transistor P34 shown in FIG. 3.

The PMOS transistors P42, P43 have their gate and drain connected to each other as in the PMOS transistor P32, and the PMOS transistors P45, P46 have their gate and drain connected to each other as in the PMOS transistor P34. As a result, a voltage of no more than VCC−2×|Vthp| is applied to the node 43 and the node 46. Thus, even if the level shift circuit uses MOS transistors lower in breakdown voltage (i.e., thinner in gate oxide film thickness) than the MOS transistors of the level shift circuit shown in FIG. 3, the circuit has a good voltage resistance. For example, a threshold voltage Vthp lower than −1.0 V (e.g., a threshold voltage Vthp of about −0.5 V), when desired, can be obtained by further increasing the number of PMOS diodes corresponding to the PMOS transistors P42, P43 and the PMOS transistors P45, P46.

In this level shift circuit, by virtue of the arrangement that a plurality of PMOS transistors P42, P43 and P45, P46 having the drain connected to the gate are. inserted, high voltages are not applied to the drains of the second and third NMOS transistors NDT2 and NDT3 which receive low voltages at their respective gates, so that breakdown is easily prevented from occurring.

However, if too many PMOS diodes are used for that purpose, the drain voltage of the PMOS transistor P41 and the PMOS transistor P44 is:

$$VCC \text{ level} - (n \times |Vthp| + \alpha) \text{ level}$$

(where $\alpha$ is the increment of the threshold voltage attributed to the backgating effect of n PMOS transistors resulting in a smaller value of $$Vgs = (n \times |Vthp| + \alpha) - VCC \tag{5}.$$

Thus, the delay of level conversion is increased.

[Fifth Embodiment]

Next, a level shift circuit of a fifth embodiment which is improved in terms of the delay of level conversion is described.

Figure 5:
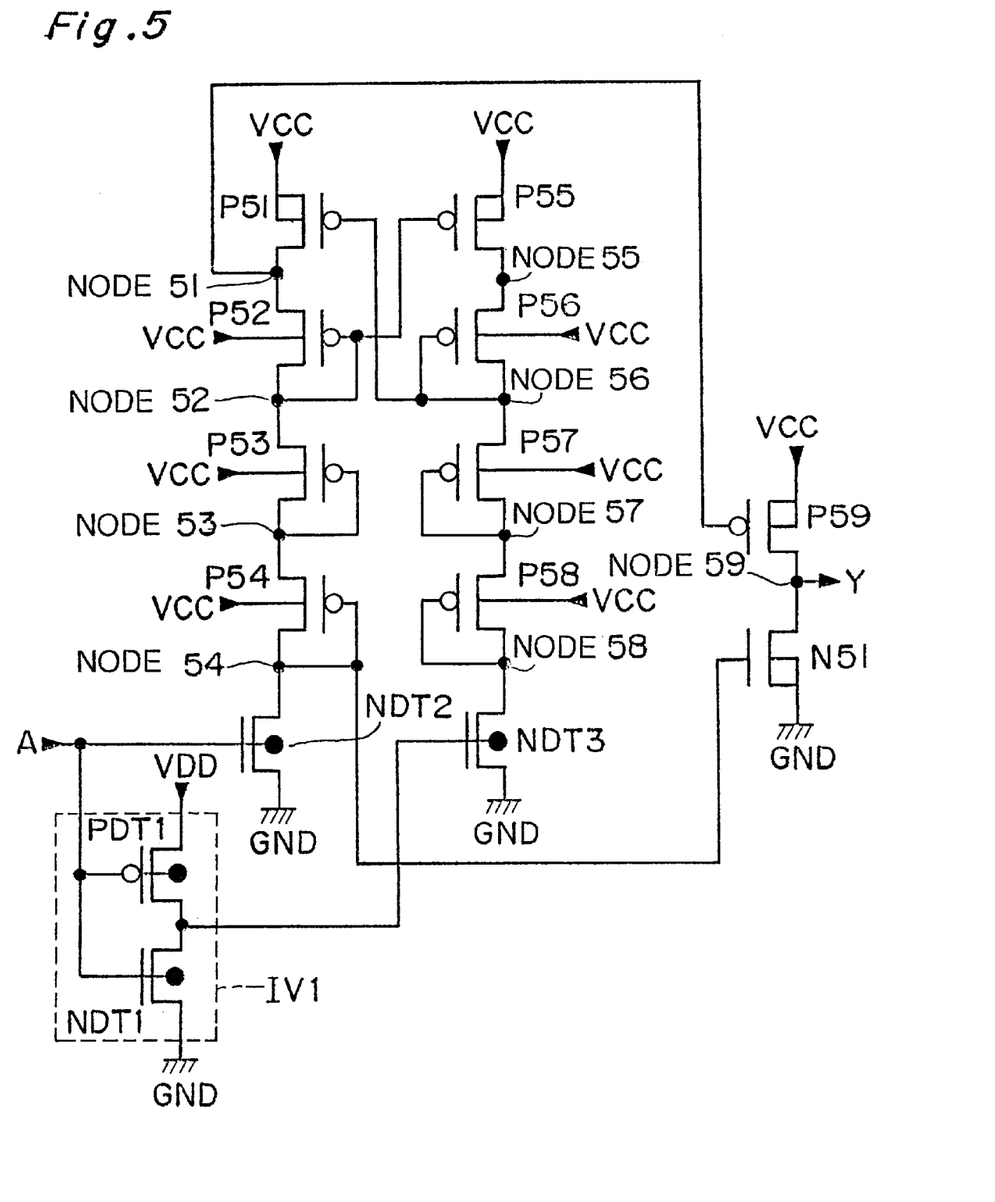
FIG. 5 is a circuit diagram of a level shift circuit according to a fifth embodiment of the invention.

FIG. 5 shows a circuit diagram of the level shift circuit of a fifth embodiment of the invention.

This level shift circuit, as shown in FIG. 5, has: an NMOS transistor NDT1 as a first first-conductivity-type MOS transistor, the gate of which is supplied with an input signal A and the source of which is connected to the ground GND; a PMOS transistor PDT1 as a first second-conductivity-type MOS transistor, the drain of which is connected to the drain of the NMOS transistor NDT1 and to the gate of which the input signal A is connected; an NMOS transistor NDT2 as a second first-conductivity-type MOS transistor, to the gate of which the input signal A is connected and the source of which is connected to the ground GND; and an NMOS transistor NDT3 as a third first-conductivity-type MOS transistor, the gate of which is connected to the drain of the NMOS transistor NDT1 and the source of which is connected to the ground GND. The NMOS transistor NDT1 and the PMOS transistor PDT1 constitute an inverter circuit IV1, and this inverter circuit IV1 operates with internal power supply VDD as a first power supply connected to the source of the PMOS transistor PDT1 and outputs an inverted signal of the input signal A. The NMOS transistor NDT1 and PMOS transistor PDT1 of the inverter circuit IV1, and the NMOS transistors NDT2, NDT3 are each a DTMOS transistor in which a channel forming semiconductor region is electrically connected to the gate.

The level shift circuit further has: a PMOS transistor P51 as a second second-conductivity-type MOS transistor, to the source of which is connected power supply VCC as a second power supply; a PMOS transistor P52 the source of which is connected to the drain (node 51) of the PMOS transistor P51; a PMOS transistor P53 the source of which is connected to the drain (node 52) of the PMOS transistor P52; a PMOS transistor P54, the source of which is connected to the drain (node 53) of the PMOS transistor P53; a PMOS transistor P55 as a third second-conductivity-type PMOS transistor, the gate of which is connected to the gate of the PMOS transistor P52 and the source of which is connected to the power supply Vcc; a PMOS transistor P56, the source of which is connected to the drain (node 55) of the PMOS transistor P55, and the drain and gate of which are connected to each other; and a PMOS transistor 46 the source of which is connected to the gate of the PMOS transistor PS1; a PMOS transistor P57, the source of which is connected to the drain (node 56) of the PMOS transistor P56; and a PMOS transistor P58, the source of which is connected to the drain (node 57) of the PMOS transistor P57 and the drain of which is connected to the drain (node 58) of the NMOS transistor NDT3. In each of the PMOS transistors P51–P58, the power supply VCC is connected to a channel forming semiconductor region. The PMOS transistors P52–P54 are fourth second-conductivity-type MOS transistors. The PMOS transistors P56–P58 are fifth second-conductivity-type MOS transistors. In the PMOS transistors P52–P54 and P56–P58, the gate is connected to the drain.

Also, the level shift circuit has an NMOS transistor N51 the gate of which is connected to the drain (node 54) of the NMOS transistor NDT2 and the source of which is connected to the ground GND, and a PMOS transistor P59 the drain of which is connected to the drain (node 59) of the NMOS transistor N51 and the gate of which is connected to the drain (node 51) of the PMOS transistor P51. In the PMOS transistor P59, the power supply VCC is connected to the source and a channel forming semiconductor region. In the NMOS transistor N51, its channel forming semiconductor region is connected to ground GND.

As shown in FIG. 5, by virtue of the arrangement that the drain (node 56) of the PMOS transistor P56 is connected to the gate of the PMOS transistor P51 and that the drain (node 52) of the PMOS transistor P52 is connected to the gate of the PMOS transistor P55, the PMOS transistors P51 and P55 are securely turned on and off. Thus, a level shift circuit exhibiting stable operation with high reliability can be provided.

The level shift circuit of the fifth embodiment shown in FIG. 5 is equivalent to the level shift circuit shown in FIG. 4 with the circuit composed of the NMOS transistors N41, N42 and the PMOS transistors P47, P48 replaced with the NMOS transistor N51 and the PMOS transistor P59. Thus, a level shift circuit involving a smaller number of transistors is provided.

In this level shift circuit, the gate voltage of the NMOS transistor N51 is:

$GND$ level$-(VCC-n\times|Vthp|-\alpha1)$ level (where $\alpha1$ is the increment of threshold voltage attributed to the backgating effect of n PMOS transistors). On the other hand, the gate voltage of the PMOS transistor P59 is:

$VCC$ level$-(n\times|Vthp|-\alpha1)$ level.

Therefore, given that the threshold voltage of the NMOS transistor N51 is Vthn1, setting the threshold voltages Vthn1 and Vthp so as to satisfy that:

$$(VCC-n\times|Vthp|-\alpha1)>Vthn1 \qquad (6),$$

and $$(VCC-n\times|Vthp|-\alpha1)>|vthp| \qquad (7)$$

makes it possible to realize a level shift circuit of low power consumption with a small number of transistors.

[Sixth Embodiment]

Figure 6:
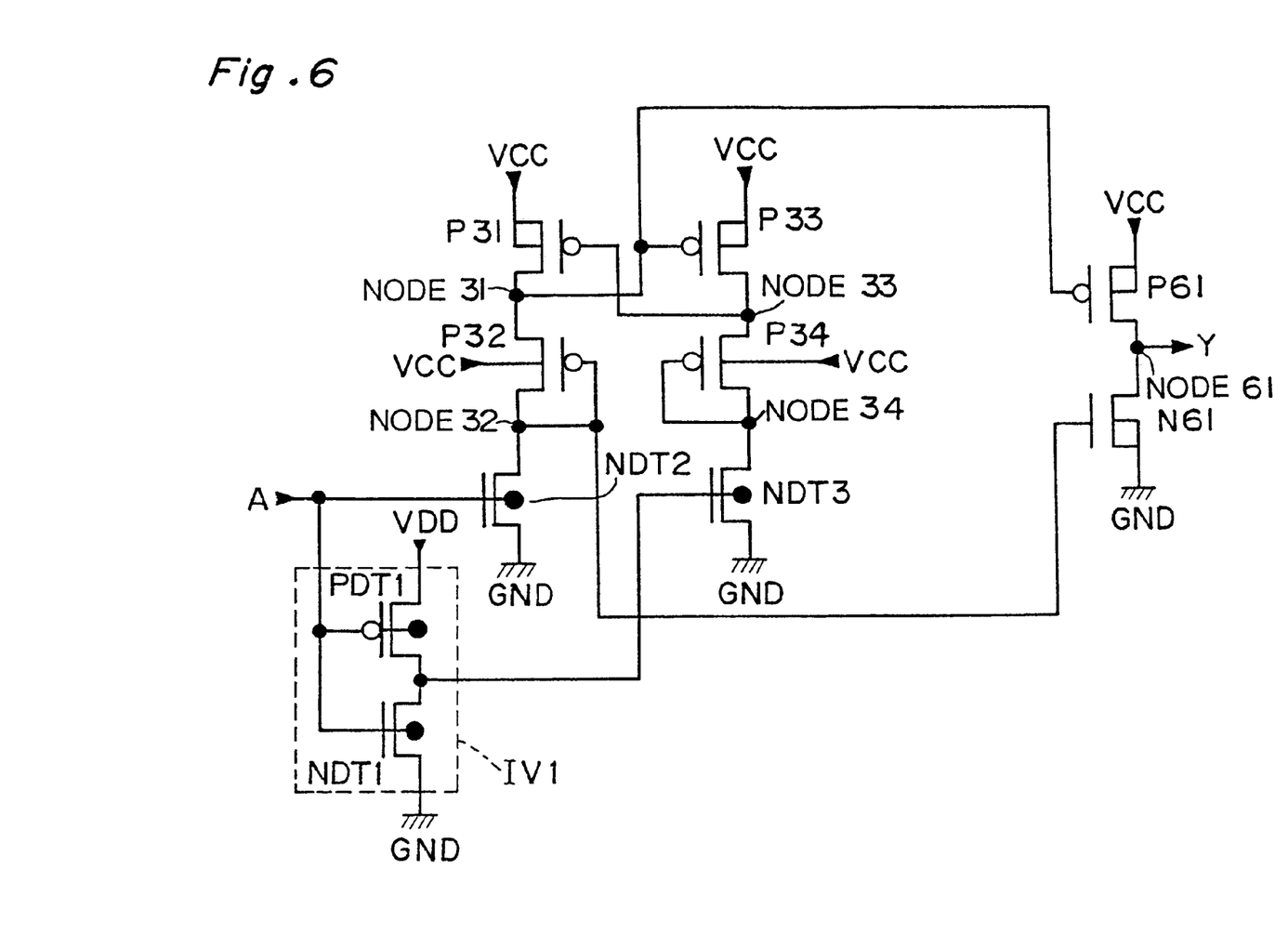
FIG. 6 is a circuit diagram of a level shift circuit according to a sixth embodiment of the invention.

FIG. 6 shows a circuit diagram of a level shift circuit according to a sixth embodiment of the invention.

This level shift circuit has same configuration as the level shift circuit shown in FIG. 3 of the third embodiment, except the output circuit. Like constituent members are designated by like reference numerals in FIG. 6 and description thereof is omitted.

In the level shift circuit, as shown in FIG. 6, the gate of the PMOS transistor P61 is connected to the drain (node 31) of the PMOS transistor P31, and the source of the PMOS transistor P61 is connected to the power supply VCC. Also, the channel forming semiconductor region of the PMOS transistor P61 is also connected to the power supply VCC. On the other hand, the gate of the NMOS transistor N61 is connected to the drain (node 32) of the NMOS transistor NDT2, and the drain (node 61) of the NMOS transistor N61 is connected to the drain of the PMOS transistor P61. The source and the channel forming semiconductor region of the NMOS transistor N61 are connected to ground GND.

In this level shift circuit, the gate voltage of the NMOS transistor N61 is:

$GND$ level$-(VCC-n\times|Vthp|)$ level, and the gate voltage of the PMOS transistor P61 is:

$VCC$ level$-|Vthp|$level.

Therefore, given that the threshold voltage of the NMOS transistor N61 is Vthn1, setting the threshold voltages Vthn1 and Vthp so as to satisfy that:

$$(VCC-|Vthp|)>Vthn1 \qquad (8),$$

$$(VCC-|Vthp|)>|Vthp| \qquad (9)$$

makes it possible to realize a level shift circuit of low power consumption with a small number of transistors.

[Seventh Embodiment]

Figure 7:
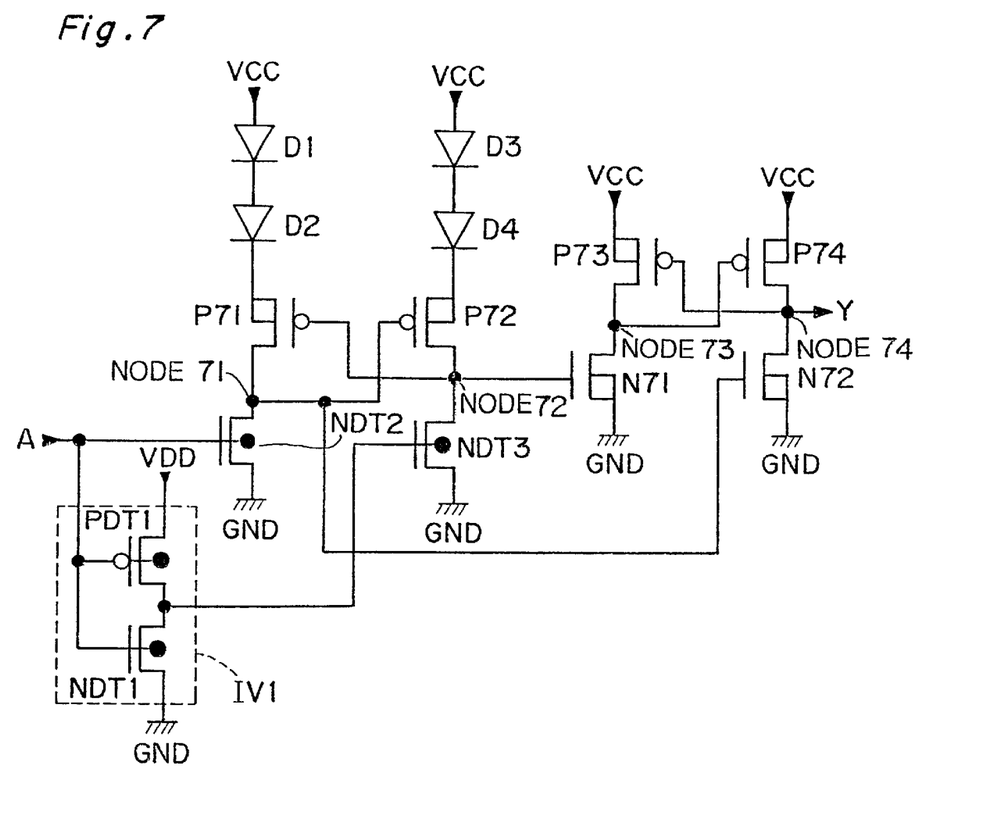
FIG. 7 is a circuit diagram of a level shift circuit according to a seventh embodiment of the invention.

FIG. 7 shows an example of the level shift circuit according to the seventh embodiment of the invention. FIG. 7 shows an example of the level shift circuit in which PN junction diodes are adopted instead of the PMOS transistors P32, P34 of FIG. 3.

This level shift circuit, as shown in FIG. 7, has: an NMOS transistor NDT1 as a first first-conductivity-type MOS transistor to the gate of which an input signal A is supplied and the source of which is connected to the ground GND; a PMOS transistor PDT1 as a first second-conductivity-type MOS transistor the drain of which is connected to the drain of the NMOS transistor NDT1 and to the gate of which the input signal A is connected; an NMOS transistor NDT2 as a second first-conductivity-type MOS transistor to the gate of which the input signal A is connected and the source of which is connected to the ground GND; and an NMOS transistor NDT3 as a third first-conductivity-type MOS transistor the gate of which is connected to the drain of the NMOS transistor NDT1 and the source of which is connected to the ground GND. The NMOS transistor NDT1 and the PMOS transistor PDT1 constitute an inverter circuit IV1, and this inverter circuit IV1 operates with internal power supply VDD as a first power supply connected to the source of the PMOS transistor PDT1 and outputs an inverted signal of the input signal A. The NMOS transistor NDT1 and PMOS transistor PDT1 of the inverter circuit IV1, and NMOS transistors NDT2, NDT3 are each a DTMOS transistor in which the channel forming semiconductor region is electrically connected to the gate.

The level shift circuit further has: a PMOS transistor P71 as a second second-conductivity-type MOS transistor the gate of which is connected to the drain (node 72) of the NMOS transistor NDT3 and the drain of which is connected to the drain (node 71) of the NMOS transistor NDT2; a PMOS transistor P72 as a third second-conductivity-type MOS transistor the gate of which is connected to the drain (node 71) of the PMOS transistor P71 and the drain of which is connected to the drain (node 72) of the NMOS transistor NDT3; PN junction diodes D1 and D2 connected in series across the source of the PMOS transistor P71 and the power supply VCC as a second power supply, with their anodes directed toward the power supply VCC and with their cathodes directed toward the source of the PMOS transistor P71; and PN junction diodes D3 and D4 connected in series across the source of the PMOS transistor P72 and the power supply VCC, with their anodes directed toward the power supply VCC and with their cathodes directed toward the source of the PMOS transistor P72.

The level shift circuit also has: an NMOS transistor N71 the gate of which is connected to the drain (node 72) of the NMOS transistor NDT3 and the source of which is connected to the ground GND; an NMOS transistor N72 the gate of which is connected to the drain (node 71) of the NMOS transistor NDT2 and the source of which is connected to the ground GND; a PMOS transistor P73 the drain of which is connected to the drain (node 73) of the NMOS transistor N71 and the source of which is connected to the power supply VCC; and a PMOS transistor P74 the drain of which is connected to the drain (node 74) of the NMOS transistor N72 and the source of which is connected to the power supply VCC. The gate of the PMOS transistor P73 is connected to the drain (node 74) of the NMOS transistor N72, while the gate of the PMOS transistor P74 is connected to the drain (node 73) of the NMOS transistor N71. The channel forming semiconductor region of each of the PMOS transistors P73 and P74 is connected to the power supply VCC, while the channel forming semiconductor region of each of the NMOS transistors N71 and N72 is connected to the ground GND.

In the level shift circuit of the above arrangement, no high voltages are applied to the drains of the NMOS transistors NDT2, NDT3 because of forward drop voltages of the PN junction diodes D1, D2 and D3, D4. Thus, the withstand voltage, or breakdown voltage, can be made higher even if the film thickness of the NMOS transistors NDT2, NDT3 is thin.

Therefore, among the NMOS transistor which is thin in gate oxide film thickness and operates at 0.5 V, the NMOS transistor which is thick in gate oxide film thickness and operates at 0.5 V, and the NMOS transistor which is thick in gate oxide film thickness and operates at 3.3 V, the difficult-to-form NMOS transistor of low threshold voltage that is thick in gate oxide film thickness and operates at 0.5 V no longer needs to be formed. Thus, the MOS transistor formation process can be simplified.

Although the PN junction diodes D1, D2 and D3, D4 in a two-stage structure are used in the seventh embodiment, the number of stages of diodes may be changeable, as required, depending on the power supply VCC, the breakdown voltage of the NMOS transistors NDT2, NDT3, and the like.

[Eighth Embodiment]

Figure 8:
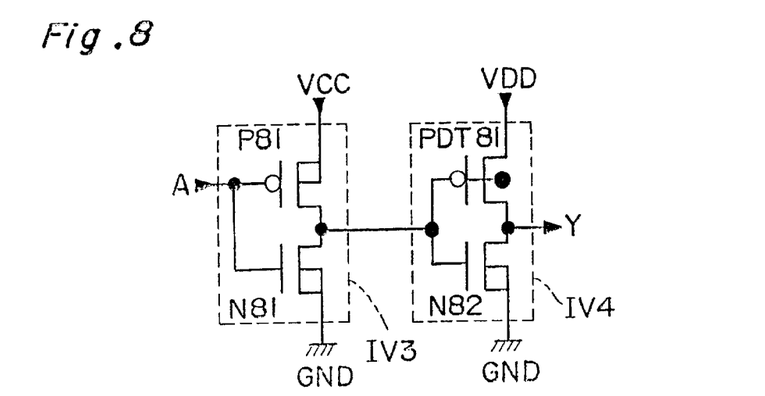
FIG. 8 is a circuit diagram of a level shift circuit according to an eighth embodiment of the invention.

FIG. 8 shows a circuit diagram of a level shift circuit according to an eighth embodiment of the invention. The level shift circuit shown in FIG. 8 of this eighth embodiment is an example in which a large swing of the input signal A from external is shifted to a small swing for internal operation.

The level shift circuit, as shown in FIG. 8, has: an NMOS transistor N81 to the gate of which an input signal A is connected and the source of which is connected to the ground GND; a PMOS transistor P81 to the gate of which the input signal A is connected, the drain of which is connected to the drain of the NMOS transistor N81, and the source of which is connected to the power source VCC; an NMOS transistor N82 as a first first-conductivity-type MOS transistor the gate of which is connected to the drain of the NMOS transistor N81 and the source of which is connected to the ground GND; and a PMOS transistor, PDT81 as a first second-conductivity-type MOS transistor the gate of which is connected to the drain of the NMOS transistor N81, the drain of which is connected to the drain of the NMOS transistor N82, and the source of which is connected to the internal power supply VDD. The channel forming semiconductor region of the NMOS transistor N81 is connected to the ground GND, while the channel forming semiconductor region of the PMOS transistor P81 is connected to the power supply VCC. The channel forming semiconductor region of the NMOS transistor N82 is also connected to the ground GND.

The NMOS transistor N81 and PMOS transistor P81 constitute an inverter circuit IV3, and the NMOS transistor N82 and PMOS transistor PDT81 constitute an inverter circuit IV4. Of the transistors of the inverter circuits, only the PMOS transistor PDT81 is a DTMOS transistor in which the channel forming semiconductor region is electrically connected to the gate.

In the level shift circuit with the above arrangement, in the case of, for example, power supply VCC=2 V and internal power supply VDD=0.5 V, if the input signal A from external is at the GND level, the inverter circuit IV3 produces an output of VCC level from an input of the external input signal A, so that the NMOS transistor N82 of the inverter circuit IV4, to which the output of the inverter circuit IV3 is connected, is turned on, and the PMOS transistor PDT81 is turned off. Therefore, an output signal Y of the inverter circuit IV4 becomes GND level. On the other hand, if the input signal A from external is at the VCC level, the inverter circuit IV3 produces an output of GND level, so that the NMOS transistor N82 of the inverter circuit IV4 is turned off, and the PMOS transistor PDT81 is turned on. Therefore, the output of the inverter circuit IV4 becomes VDD level. Thus, the external input signal having a swing of 2 V is shifted in level to a signal having a swing of 0.5 V.

Also in the level shift circuit of this constitution, for power supply VCC=3.3 and internal power supply VDD=

0.5 V, there is a need of increasing the film thickness of gate oxide to about 7 nm for all the transistors of the inverter circuit IV3 and the inverter circuit IV4. In this case, for noise margin and reduction in through current, it is desired that the PMOS transistor P81 of the inverter circuit IV3 have a higher threshold voltage, as compared with the PMOS transistor PDT81 of the inverter circuit IV4 that must be turned on at 0.5 V. Therefore, conditions for impurity ion implantation are different between the PMOS transistor P81 and the PMOS transistor PDT81.

[Ninth Embodiment]

Figure 9:
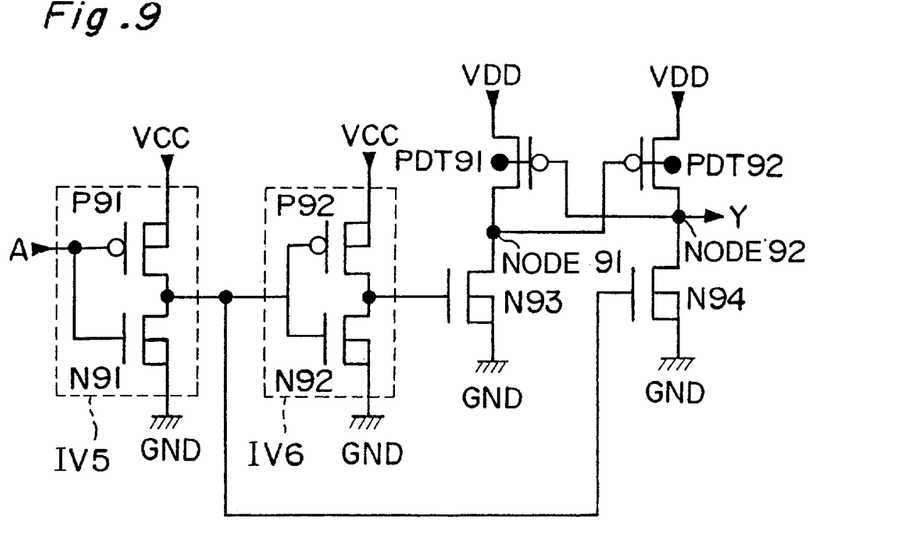
FIG. 9 is a circuit diagram of a level shift circuit according to a ninth embodiment of the invention.

FIG. 9 shows a circuit diagram of a level shift circuit according to a ninth embodiment of the invention.

This level shift circuit, as shown in FIG. 9, has: an NMOS transistor N91 as a first first-conductivity-type MOS transistor to the gate of which an input signal A is connected and the source of which is connected to the ground GND; a PMOS transistor P91 as a first second-conductivity-type MOS transistor to the gate of which the input signal A is connected, the drain of which is connected to the drain of the NMOS transistor N91, and the source of which is connected to a power supply VCC as a first power supply; an NMOS transistor N92 the gate of which is connected to the drain of the NMOS transistor N91 and the source of which is connected to the ground GND; a PMOS transistor P92 the gate of which is connected to the drain of the NMOS transistor N91, the drain of which is connected to the drain of the NMOS transistor N92, and the source of which is connected to the power supply VCC. In each of the NMOS transistors N91 and N92, the channel forming semiconductor region is electrically connected to the ground GND, while in each of the PMOS transistors P91 and P92, the channel forming semiconductor region is electrically connected to the power supply VCC.

The NMOS transistor N91 and the PMOS transistor P91 constitute an inverter circuit IV5, and the NMOS transistor N92 and the PMOS transistor P92 constitute an inverter circuit IV6.

The level shift circuit further has: an NMOS transistor N93 as a second first-conductivity-type MOS transistor the gate of which is connected to an output of the inverter circuit IV6, and the source of which is connected to the ground GND; an NMOS transistor N94 as a third first-conductivity-type MOS transistor the gate of which is connected to an output of the inverter circuit IV5, and the source of which is connected to the ground GND; a PMOS transistor PDT91 as a second second-conductivity-type MOS transistor the drain of which is connected to the drain (node 91) of the NMOS transistor N93, the gate of which is connected to the drain (node 92 of the NMOS transistor N94, and the source of which is connected to internal power supply as the second power supply VDD; and a PMOS transistor PDT92 as the third third-conductivity-type MOS transistor, the gate of which is connected to the drain (node 91) of the NMOS transistor N93, the drain of which is connected to the drain (node 92) of the NMOS transistor N93, and the source of which is connected to the internal power supply VDD. In each of the NMOS transistors N93 and N94, the channel forming semiconductor region is connected to the ground GND. Each of the PMOS transistors PDT91 and PDT92 is a DTMOS transistor in which the channel forming semiconductor region is connected to the gate.

In the level shift circuit of this constitution, the transistors of the inverter circuits IV5, IV6 and the NMOS transistors N93, N94 have a thick film thickness of gate oxide, while the PMOS transistors PDT91, PDT92 may be made thin like the PMOS transistors of the internal circuits of the LSI. Thus, there is an advantage that the fabrication process is simplified.

If any of the level shift circuits of the first to ninth embodiments is built into a system LSI as a semiconductor device, there can be provided a semiconductor device which allows the chip internal of the system LSI to be operated at low voltage while being interfaceable with external at a voltage higher than in the chip internal, and which is of low power consumption and high reliability.

The foregoing first to ninth embodiments have been described with respect to level shift circuits made up of MOS transistors in which the first conductivity type is N-channel type and the second conductivity type is P-channel type. However, the level shift circuits may also be made up of MOS transistors in which the first conductivity type is P-channel type and the second conductivity type is N-channel type.

As apparent from the above description, according to the level shift circuit of the present invention, level shift operation can be achieved between a low voltage of 0.5 V and a high voltage of 3.3 V, as an example, without slowing down the operating speed. Still, leak currents across the power supplies and ground GND via the PMOS transistors and the NMOS transistors can be reduced. Thus, low power consumption is accomplished. Further, since difficult-to-form MOS transistors which are thick in gate oxide film thickness and low in threshold voltage no longer need to be formed, the transistor formation process is simplified. Besides, by the arrangement that MOS transistors to which high voltage is applied are made thick in the film thickness of gate oxide, or that MS diodes or PN junction diodes are inserted, the issue of the breakdown of the MOS transistors constituting the level shift circuit is eliminated, and the MOS transistors are not required to be increased in gate length or gate width. Thus, there can be provided a level shift circuit of smaller circuit area.

Furthermore, when the level shift circuit of the present invention is built into a semiconductor device (system LSI etc.) which internally operates at low voltage, there can be provided a semiconductor device which is interfaceable with external at a voltage higher than in the internal of the semiconductor device, and which is of low power consumption and high reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A level shift circuit comprising:
    an inverter circuit having a first first-conductivity-type MOS transistor and a first second-conductivity-type MOS transistor connected in series to each other between a first power supply and a ground, the inverter circuit providing an inverted signal of an input signal;
    a second first-conductivity-type MOS transistor to a gate of which the input signal is connected and a source of which is connected to the ground;
    a third first-conductivity-type MOS transistor to a gate of which an output of the inverter circuit is connected, and a source of which is connected to the ground;
    a second second-conductivity-type MOS transistor whose gate is connected to a drain of the third first-conductivity-type MOS transistor, and whose source is connected to a second power supply, and whose drain is connected to a drain of the second first-conductivity-type MOS transistor; and
    a third second-conductivity-type MOS transistor whose gate is connected to the drain of the second firstconductivity-type MOS transistor, and whose source is connected to the second power supply, and whose drain is connected to the drain of the third first-conductivity-type MOS transistor, wherein the first first-conductivity-type MOS transistor and the first second-conductivity-type MOS transistor of the inverter circuit, and the second and third first-conductivity-type MOS transistors are each a MOS transistor whose channel forming semiconductor region is electrically connected to its gate, wherein the second and third first-conductivity-type MOS transistors and the second and third second-conductivity-type MOS transistors each have a gate oxide larger in film thickness than gate oxides of the first first-conductivity-type MOS transistor and the first second-conductivity-type MOS transistor of the inverter circuit.

2. The level shift circuit according to claim 1, wherein the drain of the second first-conductivity-type MOS transistor and the drain of the second second-conductivity-type MOS transistor are connected to each other via a fourth second-conductivity-type MOS transistor whose gate and drain are connected to each other, and the drain of the third first-conductivity-type MOS transistor and the drain of the third second-conductivity-type MOS transistor are connected to each other via a fifth second-conductivity-type MOS transistor whose gate and drain are connected to each other.

3. The level shift circuit according to claim 1, wherein the drain of the second first-conductivity-type MOS transistor and the drain of the second second-conductivity-type MOS transistor are connected to each other via a plurality of fourth second-conductivity-type MOS transistors whose gates are connected to their respective drains, and the drain of the third first-conductivity-type MOS transistor and the drain of the third second-conductivity-type MOS transistor are connected to each other via a plurality of fifth second-conductivity-type MOS transistors whose gates are connected to their respective drains.

4. The level shift circuit according to claim 1, wherein the drain of the second first-conductivity-type MOS transistor and the drain of the second second-conductivity-type MOS transistor are connected to each other via one or more series-connected diodes, with an anode of each diode directed toward the drain of the second second-conductivity-type MOS transistor, and with a cathode thereof directed toward the drain of the second first-conductivity-type MOS transistor, and the drain of the third first-conductivity-type MOS transistor and the drain of the third second-conductivity-type MOS transistor are connected to each other via one or more series-connected diodes, with an anode of each diode directed toward the drain of the third second-conductivity-type MOS transistor, and with a cathode thereof directed toward the drain of the third first-conductivity-type MOS transistor.

5. The level shift circuit according to claim 1, wherein the second power supply and the source of the second second-conductivity-type MOS transistor are connected to each other via one or more series-connected diodes, with an anode of each diode directed toward the second power supply, and with a cathode thereof directed toward the source of the second second-conductivity-type MOS transistor, and the second power supply and the source of the third second-conductivity-type MOS transistor are connected to each other via one or more series-connected diodes, with an anode of each diode directed toward the second power supply and with a cathode thereof directed toward the source of the third second-conductivity-type MOS transistor.

6. The level shift circuit according to claim 2, further comprising:

an output-use first-conductivity-type MOS transistor whose gate is connected to the drain of the second first-conductivity-type MOS transistor and whose source is connected to the ground; and an output-use second-conductivity-type MOS transistor whose drain is connected to a drain of the output-use first-conductivity-type MOS transistor, whose source is connected to the second power supply, and whose gate is connected to an intermediate node located between the second first-conductivity-type MOS transistor and the second second-conductivity-type MOS transistor, the intermediate node excluding the drain of the second first-conductivity-type MOS transistor.

7. The level shift circuit according to claim 3, further comprising:

an output-use first-conductivity-type MOS transistor whose gate is connected to the drain of the second first-conductivity-type MOS transistor and whose source is connected to the ground; and an output-use second-conductivity-type MOS transistor whose drain is connected to a drain of the output-use first-conductivity-type MOS transistor, whose source is connected to the second power supply, and whose gate is connected to an intermediate node located between the second first-conductivity-type MOS transistor and the second second-conductivity-type MOS transistor, the intermediate node excluding the drain of the second first-conductivity-type MOS transistor.

8. The level shift circuit according to claim 4, further comprising:

an output-use first-conductivity-type MOS transistor whose gate is connected to the drain of the second first-conductivity-type MOS transistor and whose source is connected to the ground; and an output-use second-conductivity-type MOS transistor whose drain is connected to a drain of the output-use first-conductivity-type MOS transistor, whose source is connected to the second power supply, and whose gate is connected to an intermediate node located between the second first-conductivity-type MOS transistor and the second second-conductivity-type MOS transistor, the intermediate node excluding the drain of the second first-conductivity-type MOS transistor.

9. The level shift circuit according to claim 5, further comprising:

an output-use first-conductivity-type MOS transistor whose gate is connected to the drain of the second first-conductivity-type MOS transistor and whose source is connected to the ground; and an output-use second-conductivity-type MOS transistor whose drain is connected to a drain of the output-use first-conductivity-type MOS transistor, whose source is connected to the second power supply, and whose gate is connected to an intermediate node located between the second first-conductivity-type MOS transistor and the second second-conductivity-type MOS transistor, the intermediate node excluding the drain of the second first-conductivity-type MOS transistor.

10. The level shift circuit according to claim 2, further comprising:
- an output-use first-conductivity-type MOS transistor whose gate is connected to the drain of the third first-conductivity-type MOS transistor and whose source is connected to the ground; and
- an output-use second-conductivity-type MOS transistor whose drain is connected to a drain of the output-use first-conductivity-type MOS transistor, whose source is connected to the second power supply, and whose gate is connected to an intermediate node located between the third first-conductivity-type MOS transistor and the third second-conductivity-type MOS transistor, the intermediate node excluding the drain of the third first-conductivity-type MOS transistor.

11. The level shift circuit according to claim 3, further comprising:
- an output-use first-conductivity-type MOS transistor whose gate is connected to the drain of the third first-conductivity-type MOS transistor and whose source is connected to the ground; and
- an output-use second-conductivity-type MOS transistor whose drain is connected to a drain of the output-use first-conductivity-type MOS transistor, whose source is connected to the second power supply, and whose gate is connected to an intermediate node located between the third first-conductivity-type MOS transistor and the third second-conductivity-type MOS transistor, the intermediate node excluding the drain of the third first-conductivity-type MOS transistor.

12. The level shift circuit according to claim 4, further comprising:
- an output-use first-conductivity-type MOS transistor whose gate is connected to the drain of the third first-conductivity-type MOS transistor and whose source is connected to the ground; and
- an output-use second-conductivity-type MOS transistor whose drain is connected to a drain of the output-use first-conductivity-type MOS transistor, whose source is connected to the second power supply, and whose gate is connected to an intermediate node located between the third first-conductivity-type MOS transistor and the third second-conductivity-type MOS transistor, the intermediate node excluding the drain of the third first-conductivity-type MOS transistor.

13. The level shift circuit according to claim 5, further comprising:
- an output-use first-conductivity-type MOS transistor whose gate is connected to the drain of the third first-conductivity-type MOS transistor and whose source is connected to the ground; and
- an output-use second-conductivity-type MOS transistor whose drain is connected to a drain of the output-use first-conductivity-type MOS transistor, whose source is connected to the second power supply, and whose gate is connected to an intermediate node located between the third first-conductivity-type MOS transistor and the third second-conductivity-type MOS transistor, the intermediate node excluding the drain of the third first-conductivity-type MOS transistor.

14. The level shift circuit according to claim 1, which is incorporated in a semiconductor device.

* * * * *